United States Patent [19]
Wong et al.

[11] Patent Number: 5,748,525
[45] Date of Patent: May 5, 1998

[54] ARRAY CELL CIRCUIT WITH SPLIT READ/WRITE LINE

[75] Inventors: Jack T. Wong, Fremont; Fabiano Fontana, Santa Clara; Susan Nguyen, San Jose, all of Calif.

[73] Assignee: Advanced Micro Devices, Inc., Sunnyvale, Calif.

[21] Appl. No.: 643,807

[22] Filed: May 6, 1996

Related U.S. Application Data

[63] Continuation of Ser. No. 379,102, Jan. 27, 1995, abandoned, which is a continuation of Ser. No. 137,434, Oct. 15, 1993, abandoned.

[51] Int. Cl.$^6$ .................................................. G11C 16/06
[52] U.S. Cl. .......................... 365/185.05; 365/185.01; 365/185.17; 365/185.22; 365/185.18; 365/230.06; 257/316; 257/319; 257/320; 257/322
[58] Field of Search ........................ 365/185, 218, 365/230.06, 185.01, 185.05, 185.17, 185.18, 185.22; 257/316, 319, 320, 322

[56] References Cited

U.S. PATENT DOCUMENTS

| | | | |
|---|---|---|---|
| 4,305,083 | 12/1981 | Gutierrez | 365/185 |
| 4,599,706 | 7/1986 | Guterman | 365/185 |
| 4,663,740 | 5/1987 | Ebel | 365/185 |
| 4,695,979 | 9/1987 | Tuvell et al. | 365/185 |
| 4,715,014 | 12/1987 | Tuvell et al. | 365/185 |
| 4,752,912 | 6/1988 | Guterman | 365/185 |
| 4,780,750 | 10/1988 | Nolan et al. | 365/185 |
| 4,912,534 | 3/1990 | Tanaka et al. | 365/185 |
| 4,935,648 | 6/1990 | Radjy et al. | 365/185 |
| 4,980,859 | 12/1990 | Guterman et al. | 365/185 |
| 5,081,610 | 1/1992 | Olivo et al. | 365/185 |
| 5,208,772 | 5/1993 | Kasold et al. | 365/185 |
| 5,282,161 | 1/1994 | Villa | 257/316 |

*Primary Examiner*—Joseph E. Clawson, Jr.
*Attorney, Agent, or Firm*—Benman Collins & Sawyer

[57] ABSTRACT

A cell array circuit for a programmable logic device is provided with split read and write lines in the memory cell. The circuit eliminates the need for pass gates in the speed path. The circuit includes steering logic, a row line driver circuit and a row decoder circuit to facilitate the different modes of operation of the cell array circuit.

9 Claims, 5 Drawing Sheets

| MODE | WL | WC | ACG | PT | PTG |
|---|---|---|---|---|---|
| BULK ERASE | Vcc | GND | Vpp+Vt | DON'T CARE | Vpp |
| PROGRAM | Vpp+Vt | Vpp | GND | DON'T CARE | GND |
| VERIFY | Vcc | GND | GND | =2V | GND |
| READ | Vcc | GND | GND | =2V | GND |

ARRAY CELL CIRCUIT WITH SPLIT READ/WRITE LINE

This is a continuation of Ser. No. 08/379,102, filed Jan. 27, 1995 abandoned, which is a continuation of application Ser. No. 08/137,434 filed on Oct. 15, 1993 abandoned.

FIELD OF THE INVENTION

The present invention is directed toward an memory array cell circuit and more particularly to a memory array cell circuit in which each memory cell includes split read and write lines.

BACKGROUND OF THE INVENTION

Array cells are utilized in programmable logic devices (PLD) to provide the memory portion of the devices. In a typical array cell, the read and write lines are coupled together. The lines are coupled together to provide more density to such programmable logic devices. With this type of cell is a row line driver associated with the cell which must be disconnected from the read/write line during a programming mode. This disconnection must take place to allow for a high voltage to be applied to the read/write line through a row decoder to allow the cell to be programmed. Accordingly additional circuitry must be utilized for causing this disconnection. Typically, this circuitry comprises pass gates to isolate the row line driver from the write/read line during programming. This additional circuitry adds significant delay in the speed path of the cell circuit which affects the overall performance of the PLD. This additional delay has particular significance in high speed applications. Furthermore, there is additional capacitance on the read/write line due to the existence of the programming transistors which are also connected to the read/write line. A typical PLD array block can be comprised of many array cells on the read/write line (60 cells to 130 cells). Any reduction in capacitance on the read/write line would allow the row line driver to switch from one state to another faster due to the reduction of time it would take to charge and discharge this capacitance.

Accordingly, all of the above-mentioned problems taken together affect the overall performance of this prior art cell when utilized within a PLD.

Hence, there is a long-felt but unsatisfied need to have an array cell for use in a PLD circuit that has increased performance over prior art array cells. The cell array should be one that does not require the pass gates associated with the prior art devices while maintaining the operating characteristics of the prior art.

Accordingly, the present invention is directed toward an array cell which has increased speed over prior art circuits.

SUMMARY OF THE INVENTION

The present invention comprises an array cell that has improved speed characteristics. The array cell circuit comprises a first transistor coupled to a word-line for receiving a first control signal and for providing a second control signal, a second transistor having a floating gate, the second transistor being responsive to the second control signal and a third control signal so as to induce charges on the floating gate during a write cycle. The cell circuit further includes a third transistor coupled to the second transistor for executing a read cycle, the third transistor also being coupled to a read-line which is electrically isolated from the word-line so as to minimize propagation delay of the array cell during the read cycle by reducing capacitance along the read-line caused by the gate capacitance of the first transistor. The cell circuit further comprises a row line driver circuit coupled to the read line, the row line driver circuit being responsive to a read mode for driving the read line; and a row decoder circuit coupled to the write line, the row decoder circuit being responsive to a program mode for driving the write line.

DETAILED DESCRIPTION

The present invention is directed toward an improvement in an array cell circuit. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figures 1, 2:
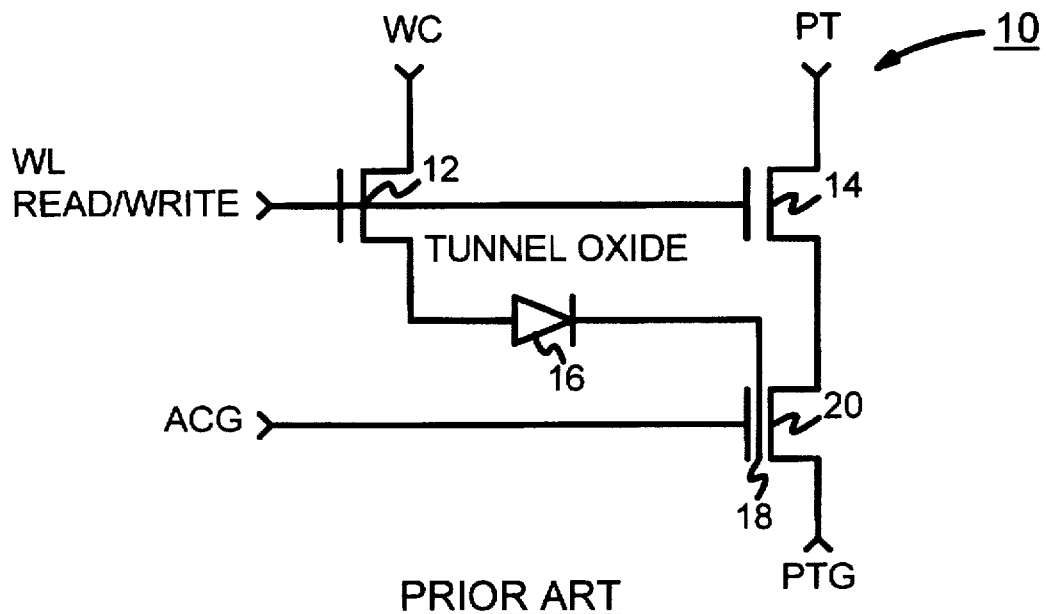
FIG. 1 is a diagram of the prior art array cell.
FIG. 2 a table of the operation of the array cell of FIG. 1.

Referring now to FIG. 1 what is shown is a prior art array cell 10. This cell 10 is typically utilized with a group of similar cells to form an array which is part of a programmable logic device. The array cell 10 comprises a n-channel transistor 12 which receives a control signal coupled to a read/write line (WL). The gate of transistor 12 is coupled to the gate of n-channel transistor 14. The drain of transistor 12 is coupled to the write control (WC) line and the source of transistor 12 is coupled to the input of diode 16. The output of diode 16 is coupled to the floating gate 18 of the n-channel transistor 20. The drain of transistor 14 is coupled to a Product Term (PT) input. The source of transistor 14 is coupled to the drain of transistor 20. The gate of transistor 20 is coupled to a Global Control Signal (ACG) input. The source of transistor 20 is coupled to a Product Term Ground (PTG) input.

In this embodiment, the read gate of transistor 12 and write transistor 14 are on the same line. Accordingly, to properly program the cell, the read and write line (WL) have to be isolated.

To more particularly explain the operation of the array cell 10 during the different modes of operation relevant to the present invention, refer now to FIG. 2 which is a table showing such operation.

The table includes the voltages on WL line, WC line, ACG line, PT line and PTG line. The modes shown in the table are the Bulk Erase, Program, Verify and Read.

The basic array shares a common PTG and PT line of a group of cells in a first direction (for example, vertical) and a WL line of the array of cells is connected in a second direction (for example, horizontal). Accordingly, along a row there will be a common WL line.

Typically, if a particular cell is to be erased, all of the cells within the array are erased at the same time (Bulk Erase Mode). The Bulk Erase Mode is utilized as opposed to Selective Erase Mode because Bulk Erase Mode is much more efficient to implement in silicon and results in a denser circuit. In this mode the WL is brought to VCC, WC (the write control) goes to ground, ACG is brought to a high voltage (VPP+$V_T$, where $V_T$ is the threshold voltage of a n-channel MOS transistor), PT is a don't care and PTG goes to VPP. Since the global (ACG) signal is at a high voltage, the cell 10 will be erased. The mechanism for this erase, commonly known as Fowler-Nordheim tunneling phenomenon, causes a negative charge (about −2.0 volts) to be stored at the floating gate of transistor 20 and therefore turns transistor 20 off.

In the program mode, the WL line is brought to a high voltage (VPP+$V_T$), the WC line is brought to a high voltage (VPP), and ACG is brought to ground. In this mode, positive charges are trapped at the floating gate of transistor 20 so that transistor 20 is conducting current. For example, if one cell is to be programmed, then, WL and WC will have a high voltage of VPP+$V_T$ and VPP respectively, at the location where the two lines cross the particular cell. Accordingly, pass gates within a row line driver are utilized to provide the isolation so that a high voltage can be applied to a WL signal.

During the read operation, the read transistor 14 is active and the write transistor 12 is inactive. WL, which is now a read line is brought up to VCC. The WC, ACG and PTG inputs are all pulled to ground. The PT signal of cell 10 is connected to a Sense Amplifier which allows the PT signal to swing from 1.8 volts to 2.2 volts. The PT signal of cell 10 is at approximately one and eight-tenths (1.8) volts if the cell is programmed and is at approximately two and two-tenths (2.2) volts if the cell is erased.

Figure 3:
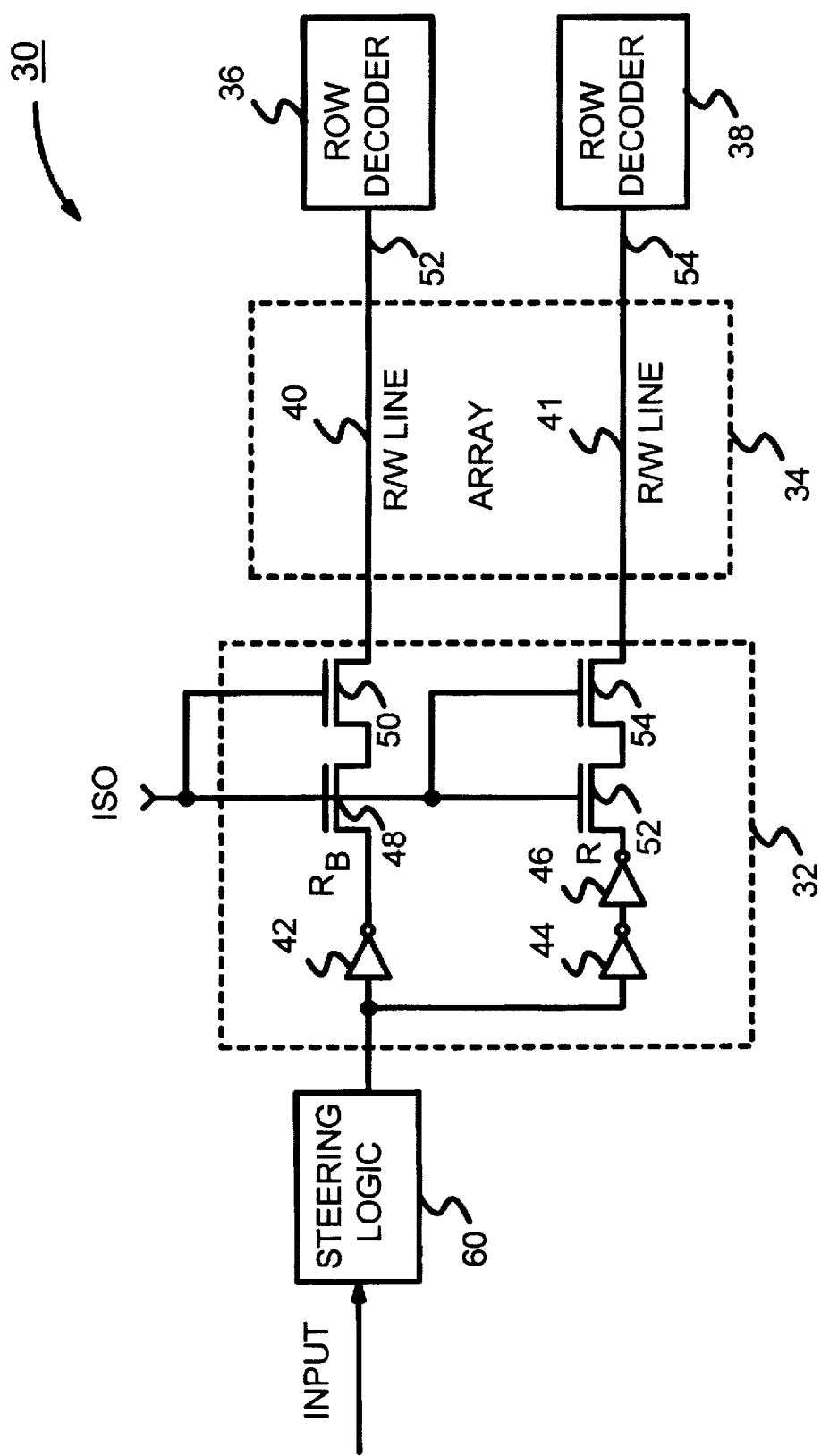
FIG. 3 is a simple block diagram of an array cell circuit that utilizes the array cell of FIG. 1.

Although this circuit 10 works effectively for its intended purpose, it has draw-backs when utilized in high speed PLD devices. To more fully explain the problems, refer now to FIG. 3 which is a simple block diagram of cell array circuit 30 that utilizes the cell 10. For simplicity of explanation of the operation of the cell array circuit 30, only the read/write lines of the cell are illustrated in this figure, to explain the present invention, but one of ordinary skill in the art will readily recognize that there are other elements required for the proper operation of the cell array circuit 30.

In this embodiment, the cell array circuit 30 includes a row line driver circuit 32 which is coupled to the cell array 34. Row Decoders 36 and 38 are coupled to the cell array circuit 30 via lines 52 and 54.

The row line driver circuit 32 receives signals from steering logic 60 and provides Row (R) or RowB ($R_B$) signals via inverters 44 and 46, or inverter 42, respectively. In series with the output of inverter 42 are two pass gates transistors 48 and 50. In series with the output of inverter 46 are pass gate transistors 52 and 54. Since the lines 40 and 41 are both read and write lines, when programming is performed the lines 40 and 41 must be isolated from the row line driver to ensure that High Voltages can be achieved on the WL line. This isolation must happen in order to prevent connection of the row line driver with the row decoder.

In this embodiment, during the programming, Bulk Erase Mode and Verify Mode, the row decoders 36 and 38 control the read/write lines 40 and 41 and the pass gates 48, 50, 52 and 54 respectively are disabled to ensure that the proper isolation takes place. However, as has been mentioned, because the pass gates are in the speed path (input to output), significant delay is added to the operation of the array cell circuit. Accordingly, what is needed is a cell array circuit that operates within the same parameters as the prior art cell array circuit 30 but minimizes the speed problems associated therewith.

Figure 4:
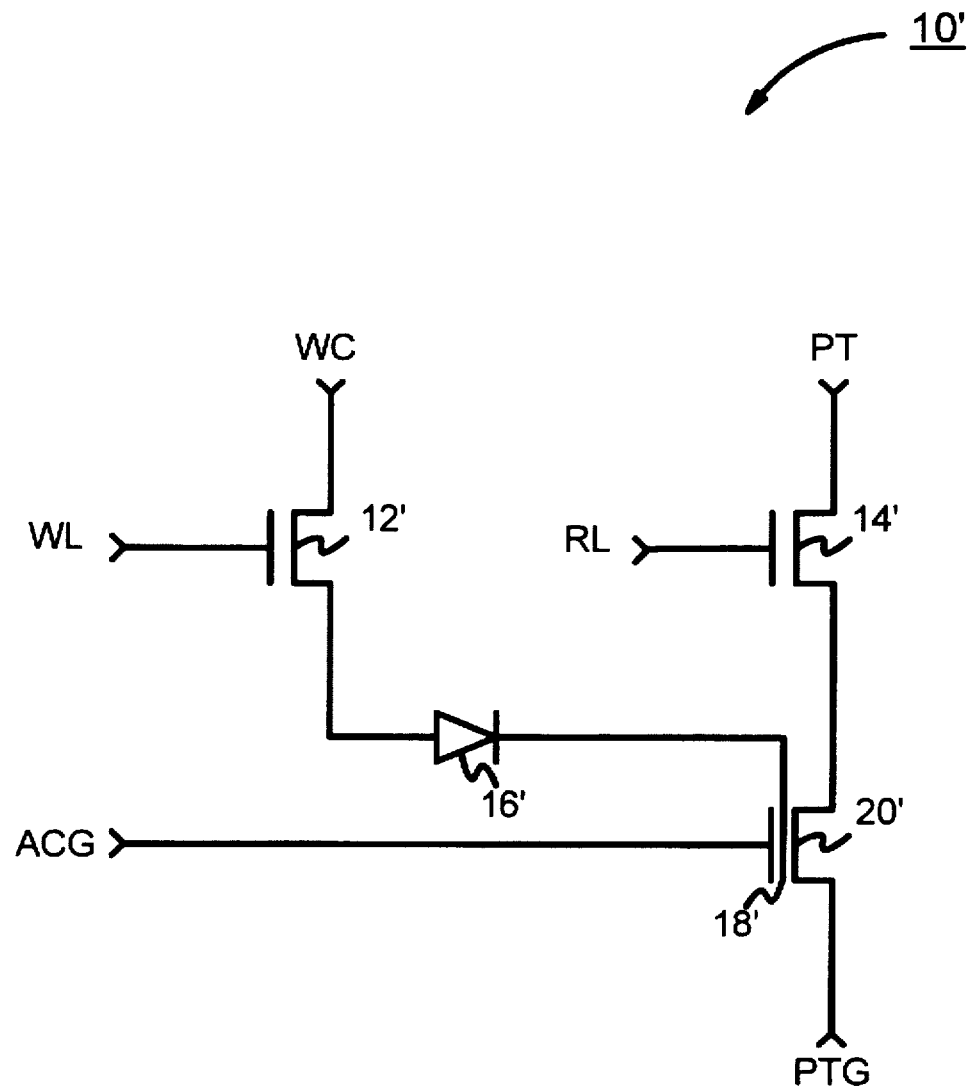
FIG. 4 is a diagram of an array cell in accordance with the present invention.

Referring now to FIG. 4, shown is a simple schematic diagram of a new array cell 10'. This array cell comprises many of the same elements of the array cell 10 of the prior art. However, a critical difference between this cell 10' and the array cell 10 of the prior art is that the read and write lines are separated. As shown, the cell write transistor 12' is coupled through the diode 16' to the floating gate of transistor 18', while the read transistor 14' is now coupled separately to a read line. By separating the read and write transistors 12' and 14' the isolation pass gates associated with the prior art cell array circuit 30 are eliminated. In so doing, the speed of the cell array in the critical path is substantially improved. Furthermore, the new cell embodiment also has less capacitance associated with it on the read line due to the elimination of the write transistors on the read signal. Gate capacitance on the read line is almost cut in half, thus also improving speed.

Figure 5:
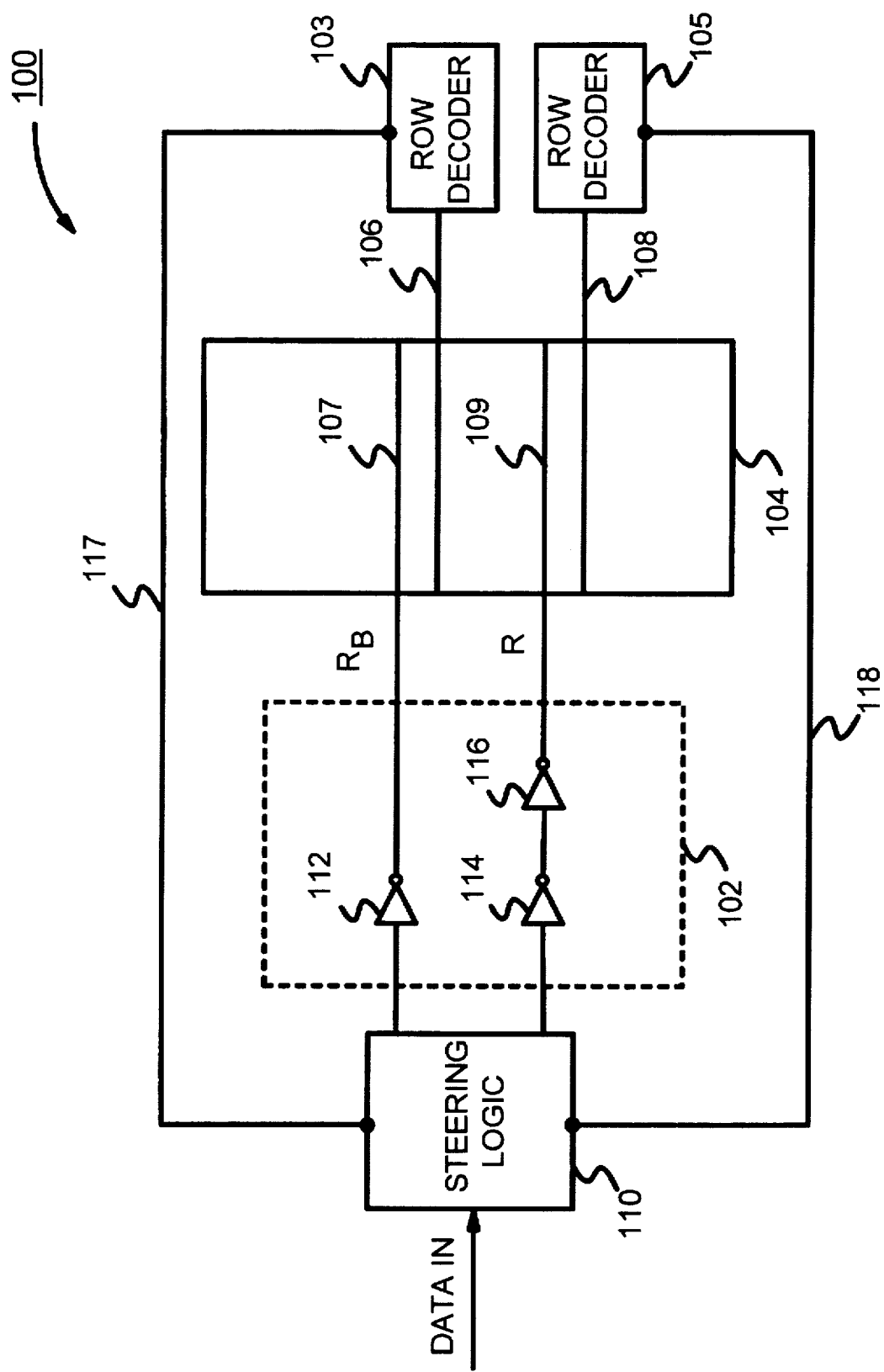
FIG. 5 is a simple block diagram of an array cell circuit utilizing the array cell of FIG. 4.

Accordingly a new cell array circuit 100 is shown in FIG. 5 that can effectively utilize this array cell 10' of FIG. 4. For simplicity of explanation of the relevant portions of the present invention, only the read/write lines of the cell are illustrated in this figure, to explain the present invention, but one of ordinary skill in the art will readily recognize that there are other elements required for the proper operation of the cell array circuit 100. The cell array circuit 100 includes steering logic 110 which is coupled to a row line driver circuit 102. The row line driver circuit 102 is coupled to the read lines 107 and 109 of the cell array 104. First and second row decoders 103 and 105 are coupled to the write lines 106 and 108. One output of the steering logic 110 is coupled to inverter 112 and a second output of the steering logic is coupled to the input of the inverter 114. The output of inverter 114 is coupled to the input of the inverter 116. In this embodiment, similar to that of FIG. 3, the output of the inverter 112 is the RowB ($R_B$) signal and the output of the inverter 116 is the Row (R) signal. Through the separation of the read and write lines, the pass gates associated with the prior art cell array circuit are eliminated.

Accordingly, during a normal read operation the row line driver circuit 102 provides the appropriate signal on the read lines. During a write operation, the row decoders 103 and 105 are utilized to drive the write lines. However, since the write and read lines are separated, for the verify mode, to work that is the mode where a particular line is read, the read lines must now have the capability to be individually selected by a row decoder, which is different than the prior art. Accordingly, in the present invention the row decoders provide the appropriate signals via lines 117 and 118 to the steering logic 110 to ensure that the verify mode is accomplished.

Figure 6:
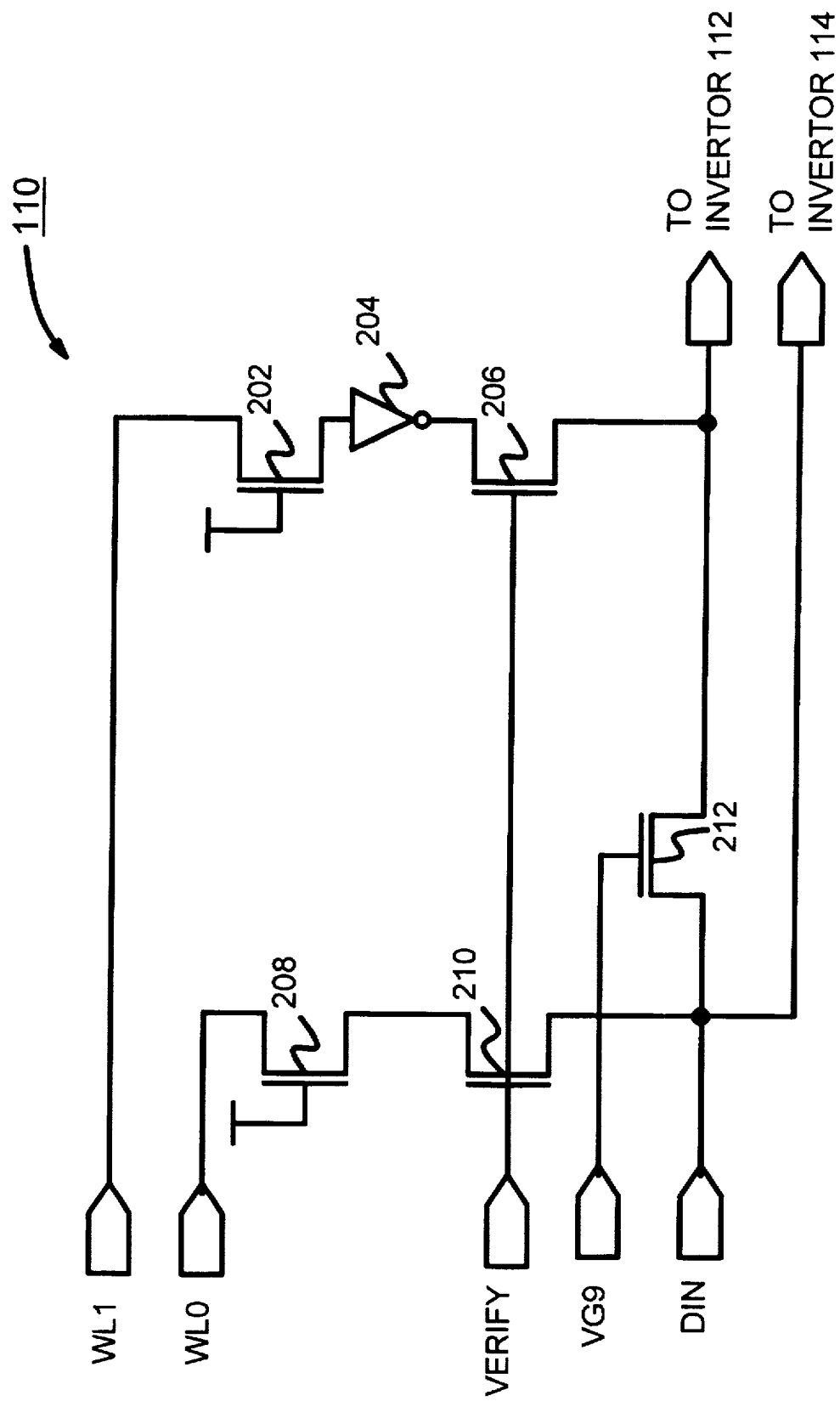
FIG. 6 is a block diagram of a preferred embodiment of the steering logic circuitry utilized in the array cell circuit of FIG. 4.

A preferred embodiment of steering logic circuit 110 is shown in FIG. 6. The steering logic circuit 110 includes a WL1 input from row decoder 103 (FIG. 5) and WL0 input received from row decoder 105. The WL1 input is coupled to the drain of n channel transistor 202. The gate of transistor 202 is coupled to VCC and the source of transistor 202 is coupled to an input of inverter 204. The output of inverter 204 is coupled to the drain of transistor 206. The source of transistor 206 is coupled to the output of the steering logic circuit and is also coupled to inverter 112 of the row line driver 102 (FIG. 5).

The WL0 input is coupled to the drain of n-channel transistor 208. The gate of transistor 208 is coupled to VCC and the source of transistor 208 is coupled to the drain of n channel transistor 210. The gate of transistor 210 is coupled to the gate of transistor 206 and is coupled to the verify mode input. The source of transistor 210 is coupled to the data in input and the source of transistor 212. The gate of transistor 212 is coupled to the VG9 input. The data in input is also coupled to the input of inverter 114 of the row line driver 102 (FIG. 5).

This steering logic circuitry 110 is responsive to the appropriate signals on the WL1 or WL0 lines from the row decoders and high signal on the verify mode input. This circuitry allows the read lines to be activated in the verify mode. Transistor 212 is in the speed path when turned on, however, the time delay due to transistor 212 is less than the time delay due to inverters 114 and 116 (FIG. 5) of the row line drivers which is the path that determines the worst case speed.

Accordingly through the separation of the read and write lines in the array cell and allowing the row driver to drive the read lines during read mode and the row decoders drive the write line during programming mode, the isolation pass gates are eliminated. In so doing, the critical path speed is significantly increased. It has been found that, for example, in certain PLD applications, there is as much as a 0.75 nanosecond speed improvement over the prior art cell array circuit.

It is understood that the above-described embodiment is merely illustrative of the possible specific embodiments which can represent applications of the principles of the present invention. One of ordinary skill in the art will see that numerous and various other arrangements can be readily devised in accordance with these principles without departing from the spirit and scope of the present invention. Accordingly, many modifications may be made by one of ordinary skill in the art without departing from the spirit and scope of the appended claims.

What is claimed is:

1. An array cell circuit comprising:
 a first transistor coupled to a write line for receiving a first control signal and for providing a second control signal, the first transistor having a source;
 a second transistor having a floating gate, the source of the first transistor coupled to the floating gate of the second transistor, the second transistor being responsive to the second control signal and a third control signal so as to induce charges on the floating gate during a write cycle; and
 a third transistor coupled to the second transistor for executing a read cycle, the third transistor also being coupled to a read line which is electrically isolated from the write line so as to minimize propagation delay of the array cell during the read cycle by reducing capacitance along the read line caused by the gate capacitance of the first transistor;
 a row line driver circuit coupled to the read line, the row line driver circuit comprising first, second, and third inverters and being responsive to a read mode for driving the read line;
 a row decoder circuit coupled to the write line, the row decoder circuit being responsive to a program mode for driving the write line; and
 steering logic coupled between the row line driver circuit and the row decoder circuit, the steering logic comprising a first plurality of transistors and a fourth inverter coupled to the first inverter of the row line driver circuit for driving a first row line, a second plurality of transistors coupled to the second and third inverters of the row line driver circuit for driving a second row line, and a fourth transistor coupling the first plurality of transistors to the second plurality of transistors at first and second common nodes.

2. The array cell circuit of claim 1 in which the row decoder enables the steering logic to read a particular line in response to a verify mode signal on the input of the steering logic.

3. The array cell circuit as recited in claim 1, wherein the charges induced on the floating gate during the write cycle are positive charges.

4. The array cell circuit as recited in claim 1, further comprises a tunnel oxide diode coupled between the first transistor and the floating gate for providing an electrical conduction therebetween during the write cycle and for providing an electrical isolation therebetween during the read cycle.

5. The array cell circuit as recited in claim 4, wherein the first transistor is a n-channel MOS device.

6. The array cell circuit as recited in claim 5, wherein the second transistor is a n-channel MOS device.

7. The array cell circuit as recited in claim 6, wherein the third transistor is a n-channel MOS device.

8. An array cell circuit comprising:
 a first n-channel MOS transistor coupled to a first write line for receiving a first control signal and for providing a second control signal, the first transistor having a source;
 second n-channel MOS transistor having a floating gate, the source of the first n-channel MOS transistor coupled to the floating gate of the second n-channel MOS transistor, the second n-channel MOS transistor being responsive to the second control signal and a third control signal so as to induce charges on the floating gate during a write cycle;
 a third n-channel MOS transistor coupled to the second n-channel MOS transistor for executing a read cycle, the third n-channel MOS transistor also being coupled to a first read line which is electrically isolated from the first write line so as to minimize propagation delay of the array cell during the read cycle by reducing capacitance along the first read line caused by the gate capacitance of the first n-channel MOS transistor;
 a tunnel oxide diode coupled between the first n-channel MOS transistor and the floating gate for providing an electrical conduction therebetween during the write cycle and for providing an electrical isolation therebetween during the read cycle;
 a row line driver circuit coupled to the first read line, the row line driver circuit further comprising
  a first inverter coupled to the first read line for providing a first row signal; and
  a second and a third inverter coupled in series and coupled to a second read line for providing a second row signal;
 a row decoder circuit coupled to the first write line for driving the first write line in response to a program mode; and
 steering logic coupled between the row line driver circuit and the row decoder circuit, the steering logic comprising a first plurality of transistors and a fourth inverter coupled to the first inverter of the row line driver circuit for driving the first row signal, a second plurality of transistors coupled to the second and third inverters of the row line driver circuit for driving the second row signal, and a fourth transistor coupling the first plurality of transistors to the second plurality of transistors at first and second common nodes.

9. An array cell circuit comprising:

a first transistor coupled to a first write line for receiving a first control signal and for providing a second control signal, the first transistor having a source;

a second transistor having a floating gate, the source of the first transistor coupled to the floating gate of the second transistor, the second transistor being responsive to the second control signal and a third control signal so as to induce charges on the floating gate during a write cycle; and a third transistor coupled to the second transistor for executing a read cycle, the third transistor also being coupled to a first read line which is electrically isolated from the first write line so as to minimize propagation delay of the array cell during the read cycle by reducing capacitance along the first read line caused by the gate capacitance of the first transistor;

a row line driver circuit coupled to the first and a second read line, the row line driver circuit comprising first, second and third inverters and being responsive to a read mode for driving the first and second read lines;

a row decoder circuit coupled to the first write line, the row decoder circuit being responsive to a program mode for driving the first write line; and steering logic coupled to the row line driver circuit, the steering logic comprising a fourth, fifth, sixth, seventh, and eighth transistors, the fourth transistor being coupled to the first write line and to the fifth transistor, the fifth transistor being further coupled at a first common node to a sixth transistor and to the second inverter of the row line driver circuit, the seventh transistor being coupled to a second write line and to a fourth inverter, and the eighth transistor being coupled to the fourth inverter and to the sixth transistor and the first inverter of the row line driver at a second common node.

\* \* \* \* \*